United States Patent
Kwon et al.

(10) Patent No.: US 7,586,135 B2
(45) Date of Patent: Sep. 8, 2009

(54) MULTILEVEL INTEGRATED CIRCUIT DEVICES AND METHODS OF FORMING THE SAME

(75) Inventors: Wook-Hyun Kwon, Gyeonggi-do (KR); Ki-Nam Kim, Seoul (KR); Chan-Kwang Park, Seoul (KR); Soon-Moon Jung, Gyeonggi-do (KR); Sang-Pil Sim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 180 days.

(21) Appl. No.: 11/606,569

(22) Filed: Nov. 30, 2006

(65) Prior Publication Data

US 2007/0176214 A1 Aug. 2, 2007

(30) Foreign Application Priority Data

Jan. 27, 2006 (KR) ...................... 10-2006-0008673

(51) Int. Cl.
*H01L 29/80* (2006.01)
(52) U.S. Cl. ................... 257/250; 257/278; 257/315
(58) Field of Classification Search ............. 257/250, 257/278, 315
See application file for complete search history.

(56) References Cited

U.S. PATENT DOCUMENTS

| | | | |
|---|---|---|---|
| 5,429,968 A | 7/1995 | Koyama | ...................... 437/48 |
| 5,492,851 A * | 2/1996 | Ryou | ......................... 438/152 |
| 2003/0094635 A1* | 5/2003 | Yaegashi | ..................... 257/250 |
| 2005/0179061 A1* | 8/2005 | Jang et al. | .................... 257/208 |
| 2006/0256964 A1* | 11/2006 | Gu et al. | ..................... 380/242 |

FOREIGN PATENT DOCUMENTS

| | | |
|---|---|---|
| JP | 05021758 | 1/1993 |
| JP | 11-145431 | 5/1999 |
| JP | 2002368141 | 12/2002 |
| KR | 1019940003024 | 4/1996 |
| KR | 1020030055804 | 7/2003 |
| KR | 1020040063348 | 7/2004 |
| KR | 1020050073956 | 7/2005 |
| KR | 1020050093064 | 9/2005 |

* cited by examiner

*Primary Examiner*—Phat X Cao
(74) *Attorney, Agent, or Firm*—Myers Bigel Sibley & Sajovec

(57) ABSTRACT

Semiconductor devices including a plurality of semiconductor layers. A plurality of transistors are on each of the semiconductor layers. The transistors include gate lines and have source regions and drain regions formed between the gate lines in the respective semiconductor layer including the transistors. The semiconductor devices further include a plurality of local source line structures. Each of the local source line structures is positioned on a corresponding one of the semiconductor layers and connects a plurality of the source regions formed on the corresponding one of the semiconductor layers. Methods of forming the semiconductor devices are also provided.

21 Claims, 12 Drawing Sheets

MULTILEVEL INTEGRATED CIRCUIT DEVICES AND METHODS OF FORMING THE SAME

CROSS-REFERENCE TO RELATED APPLICATION

This application is related to and claims priority under 35 USC § 119 from Korean Patent Application No. 2006-0008673, filed on Jan. 27, 2006 in the Korean Intellectual Property Office, the disclosure of which is incorporated herein by reference in its entirety.

BACKGROUND OF THE INVENTION

The present invention relates to integrated circuit (semiconductor) devices and methods of forming the same, and more particularly, to a multilevel integrated circuit devices and methods of forming the same.

Many modern electronic appliances include integrated circuit (semiconductor) devices having electronic elements, such as transistors, resistors, and capacitors. The semiconductor devices are generally designed and manufactured to perform predetermined functions associated with operation of the electronic appliances. For example, electronic appliances, such as computers and digital cameras, typically include semiconductor devices, such as a memory chip for storing information and a processing chip for controlling information control, which chips are formed on an integrated circuit (semiconductor) substrate.

To meet consumer expectations of performance and pricing for such electronic appliances, it may be desirable to improve the integration density and the operating speed of the semiconductor devices. To improve the integration density, the electronic elements constituting the semiconductor device generally are formed smaller than with less highly integrated semiconductor devices. As the level of miniaturization in the electronic elements generally depends on the developing speed of a manufacturing technique (especially, photolithography) in a semiconductor device, the development of an advanced processing technique may be desirable in forming the highly integrate the semiconductor devices. The development of advanced process techniques for this purpose is typically costly and long development periods may be required, which limits progress in improving speed in the integration of the semiconductor device.

Techniques have been proposed that arranges semiconductor transistors in a multilevel structure. For example, a NOR flash memory having a multilevel structure is described in Japanese Patent Publication No. 11-145431. When forming the transistors in a multilevel structure, more transistors can generally be formed on an identical area. Therefore, the integration of the semiconductor device may be significantly increased.

As the operating speed of the semiconductor device typically largely depends on a line structure thereof, the resistance of lines in the line structure may need to be reduced to increase the operating speed of the device. However, in the case of a semiconductor device having a multilevel transistor structure, the transistors are generally arranged three-dimensionally, such that a structure of lines connecting the transistors typically becomes more complex. As a result, the resistances of the lines in the line structure typically increases. For example, according to the Japanese Patent Publication No. 11-145431, drain regions of transistors constituting a NOR memory cell array are connected to a bit line through a predetermined select transistor. In this case, as the bit line and the drain region are electrically connected through a channel region of the select transistor, electric resistance increases between the bit line and the drain region. One of the main advantages of the NOR flash memory is typically a fast reading speed, but the increase in electric resistance generally deteriorates quality of the NOR flash memory.

Furthermore, according to the Japanese Patent Publication No. 11-145431, it is difficult to apply a self aligned source (SAS) technique that is generally used in connecting the source regions of the NOR flash memory. More specifically, the SAS technique includes removing device isolation layer patterns to expose a semiconductor substrate in a direction parallel to word lines, and implanting impurities on the exposed semiconductor substrate. An example of the SAS technique is disclosed in Korea Patent Publication No. 10-2003-0100489. In the case of the NOR flash memory of the Japanese Patent Publication No. 11-145431, the semiconductor layers formed on the semiconductor substrate have a thickness identical to the device isolation layer pattern thereof. That is, the device isolation layer pattern passes through the semiconductor layer, such that the semiconductor layer is divided into a plurality of separated regions. Consequently, the separated regions of the semiconductor layer are not connected to each other, and they are not used as common source regions of the NOR flash memory.

SUMMARY OF THE INVENTION

Some embodiments of the present invention provide semiconductor devices including a plurality of stacked semiconductor layers. A plurality of transistors are on each of the semiconductor layers. The transistors include gate lines and have source regions and drain regions formed between the gate lines in the respective semiconductor layer including the transistors. The semiconductor devices further include a plurality of local source line structures. Each of the local source line structures is positioned on a corresponding one of the semiconductor layers and connects a plurality of the source regions formed on the corresponding one of the semiconductor layers.

In further embodiments, the semiconductor devices also include a plurality of bit lines overlying the semiconductor layers. The local source line structures extend in a direction crossing the bit lines. The semiconductor device further includes a plurality of drain plugs, ones of which connect associated ones of the drain regions formed on a plurality of different ones of the semiconductor layers to associated ones of the bit lines. The plurality of semiconductor layers may be single crystal silicon layers. One or more of the plurality of semiconductor layers may be epitaxial layers.

In other embodiments, the drain plugs connect the associated ones of the drain regions to the associated ones of the bit lines without an intervening select transistor. The bit lines and the local source line structures may be a metal material. The metal material of the local source line structures may be a material that is stable at temperatures higher than a deposition temperature for forming a silicon thin film.

In other embodiments, the local source line structures each include a metal local source line and a plurality of local source plugs. The metal local source line extends in a direction parallel to the gate lines and overlie the plurality of source regions connected by the local source line. The plurality of local source plugs connect the local source line to the underlying source regions. Respective ones of the local source plugs connect an associated one of the plurality of source regions underlying the local source line. In other embodiments, a local source pattern is positioned between the local source line and the plurality of source regions underlying the local source line. A bottom of the local source pattern contacts tops of the underlying source regions.

In yet further embodiments, each of the drain plugs extend in a vertical direction from a lowest one of the semiconductor layers to at least one overlying semiconductor layer to connect drain regions on the lowest one and the at least one overlying one of the semiconductor layers to the associated one of the bit lines. The bit lines overlie the plurality of semiconductor layers. Each of the bit lines may extend in a direction substantially orthogonal to the gate lines and electrically connect to an associated plurality of the drain plugs. The semiconductor devices may further include device isolation layer patterns disposed on a predetermined region of each of the semiconductor layers to define active regions therein. A lowest one of the semiconductor layers may have a thickness greater than a thickness of the device isolation layer pattern formed thereon. All overlying ones of the semiconductor layers may have a thickness substantially identical to a thickness of device isolation layer patterns formed thereon. Semiconductor layers, except for a lowest one of the semiconductor layers, may be divided into a plurality of independent active regions by device isolation layer patterns formed on the semiconductor layers.

In other embodiments, the gate lines are a non-volatile memory gate structure. The gate lines include control gate patterns crossing over the active regions, floating gate patterns between the control gate patterns and the active regions and gate interlayer insulation patterns between the floating gate patterns and the control gate patterns. The source regions connected by the local source line structures and the drain regions connected by the bit lines may be alternately arranged on the active regions between the gate lines and the transistors form a cell array of a NOR flash memory. The drain plugs may pass through drain regions of ones of the semiconductor layers to reach a lowest one of the semiconductor layers.

In further embodiments, the local source line structures are connected to a global source line through a global source plug structure including a plurality of substantially aligned plugs. Ones of the local source line structures may be connected to a global source line through respective different offset global source plug structures.

In yet other embodiments, methods for fabricating a semiconductor device include forming a stacked plurality of semiconductor layers. A plurality of transistors are formed on each of the semiconductor layers. The transistors include gate lines and have source regions and drain regions formed between the gate lines in the respective semiconductor layer including the transitors. Bit lines and a global source line are formed on an uppermost one of the semiconductor layers. Local source line structures are formed on each of the semiconductor layers. The local source line structures connect the source regions formed on each of the semiconductor layers and extend in a direction that crosses the bit lines.

In further embodiments, forming the local source line structures includes forming the local source line structures of a conductive metal material and the method further includes forming drain plugs connecting associated ones of the drain regions formed on different ones of the semiconductor layers to associated ones of the bit lines. Forming the plurality of transistors may include forming device isolation layer patterns in predetermined regions of the semiconductor layers to define active regions, forming a gate insulation layer on the active regions, forming the gate lines crossing over the active regions on the gate insulation layer; and forming the source regions and the drain regions in the active regions between the gate lines. The device isolation layer patterns formed on any upper ones of the semiconductor layers, other than a lowest one of the semiconductor layers, may have a thickness substantially identical to a thickness of the semiconductor layer in which they are formed.

In other embodiments, the upper ones of the semiconductor layers are formed by an epitaxial process, using the lowest semiconductor layer as a seed layer, to provide the upper ones of the semiconductor layers a single crystal structure. The epitaxial process may include growing a single crystal silicon layer at about 800° C. using processing gases including DCS (dichlorosilane) and HCl (hydrochloric acid) that are supplied at a flow ratio of about 1.5:1 to about 2.5:1 and thermally treating the grown single crystal silicon layer.

In further embodiments, the gate lines form a non-volatile memory gate. Forming the gate lines includes forming control gate patterns crossing over the active regions, forming floating gate patterns between the control gate patterns and the active regions and forming gate interlayer insulation layer patterns between the floating gate patterns and the control gate patterns. The source regions and the drain regions may be alternately disposed on the active regions between the gate lines to form the transistors as a cell array of a NOR flash memory.

In yet other embodiments, forming the drain plugs includes forming drain plugs coupling through the drain regions of overlying ones of the semiconductor layers to couple to underlying ones of the semiconductor layers. Forming the local source line structures may include forming local source plugs disposed on the source regions of each of the semiconductor layers and forming metal local source lines on each of the semiconductor layers, the local source lines connecting the local source plugs on the respective semiconductor layers in a direction substantially parallel to the gate lines. The local source plugs may be formed in a bar shape parallel to the gate lines to cross over and connect associated ones of the source regions. The drain plugs may be included in drain plug structures, the drain plug structures including a stacked structure of segments of the drain plugs and pads interposed between the segments of the drain plugs to provide drain plug structures having a stack-via plug structure. The pads may be formed while forming the local source line to provide the pads a thickness and material identical to those of the local source line.

In further embodiments, the methods further include forming a global source plug structure connecting the local source line structures and the global source line. The global source plug structure are formed while forming the drain plug structure. Respective ones of the local source line structures may be connected to the global source line through respective different offset global source plug structures or may be connected to the global source line through a global source plug structure including a plurality of substantially aligned plugs.

BRIEF DESCRIPTION OF THE DRAWINGS

The accompanying drawings, which are included to provide a further understanding of the invention and are incorporated in and constitute a part of this application, illustrate some embodiments of the invention and together with the description serve to explain the invention. In the drawings.

DETAILED DESCRIPTION

Figure 1:
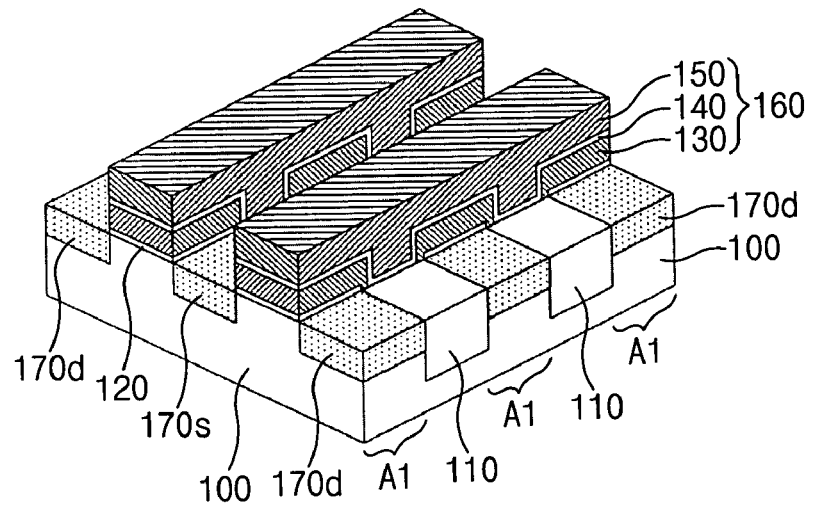
FIGS. 1 through 8 are perspective views illustrating methods of fabricating a semiconductor device according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Embodiments of the present invention will now be described with reference to FIGS. 1 through 8. FIGS. 1 through 8 are perspective views illustrating methods of fabricating a semiconductor device according to some embodiments of the present invention. More particularly, for purposes of explanation herein, the embodiments illustrated in FIGS. 1 through 8 will be described with reference to formation of a NOR flash memory device having a multilevel structure. However, some embodiments of the present invention more generally provide methods for fabricating a semiconductor device having a multilevel structure.

Referring first to the embodiments illustrate in FIG. 1, first device isolation layer patterns 110 defining first active regions A1 are formed on a predetermined region of a semiconductor (integrated circuit) substrate 100. The semiconductor substrate 100 provides the lowest bottom layer in multi-layer semiconductor in the illustrated embodiments. As such, the semiconductor substrate 100 may referred to herein as a first semiconductor layer. According to come embodiments of the present invention, the first semiconductor layer 100 is formed of silicon of a single crystal structure. First device isolation layer patterns 110 may be formed using a shallow trench isolation (STI) technique to define the active regions A1. Additionally, the first device isolation layer patterns 110 may be arranged in parallel along a predetermined direction. Each of the first device isolation layer patterns 110 may have a bar shape with a large aspect ratio. Consequently, the first active regions A1 may be arranged parallel to the first device isolation layer patterns 110.

A first gate insulation layer 120 is shown formed on the first active regions A1. The first gate insulation layer 120 may be a silicon oxide layer formed, for example, using a thermal oxidation process. However, other kinds of insulation layers, such as a silicon nitride layer, may be used.

First gate lines 160 crossing over the first active regions A1 are shown formed on the first semiconductor layer 100. Each of the first gate lines 160 is shown as a multi-layer structure including first floating gate electrodes 130, a first gate interlayer insulation layer pattern 140 covering the first floating gate electrodes 130, and a first control gate electrode 150. The first floating gate electrodes 130 are shown as two-dimensionally arranged on the first active regions A1, and are separated from each other. The first gate interlayer insulation layer pattern 140 and the first control gate electrode 150 cover the first floating gate electrodes 130 in a direction crossing over the first active regions A1. Consequently, each of the first gloating gate electrodes 130 is electrically separated from different conductive structures (e.g., another first floating gate electrode and/or another first control gate electrode) and, thus, can be used as a structure for storing information in a non-volatile memory.

The first floating gate electrode 130 can be a polycrystal silicon layer, and the first gate interlayer insulation layer 140 can be a silicon oxide layer and/or a silicon nitride layer. The first control gate electrode 150 can be formed of a stacked polycrystal silicon layer and metal conductive layer.

First impurity regions used as first source regions 170s and first drain regions 170d are formed on the first active regions A1 between the first gate lines 160. The first impurity regions may be formed by an ion implantation process using the first gate lines 160 as a mask. While not shown in FIG. 1, spacers may be formed on sidewalls of the first gate lines 160. The spacers may be used as an ion implantation mask.

Figure 2:
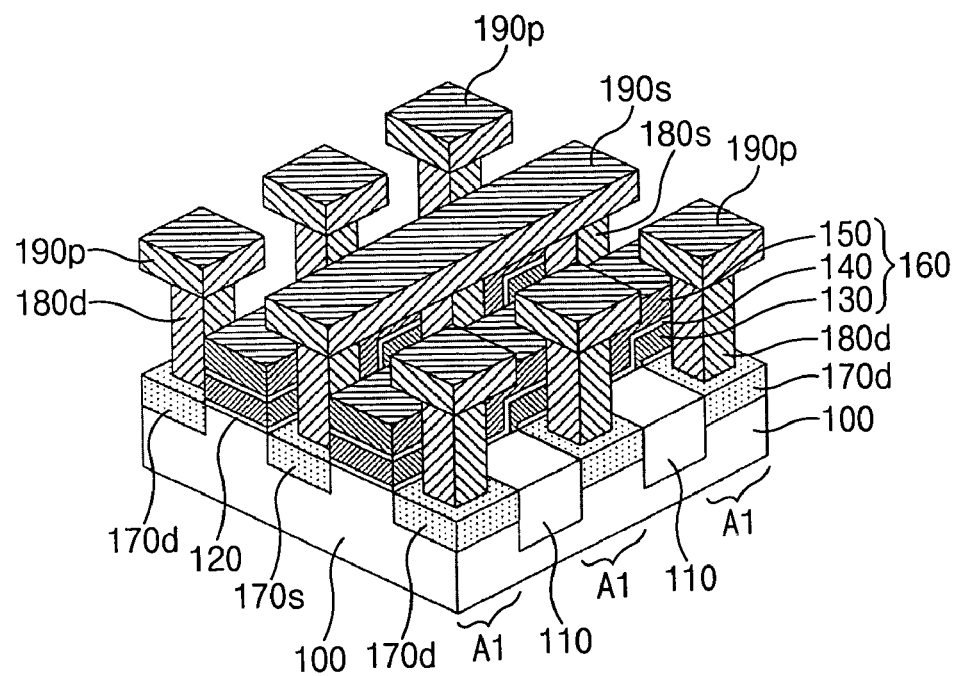

Referring next to FIG. 2, a first lower interlayer insulation layer (not shown) is formed on the substrate 100 including the first impurity regions. The first lower interlayer insulation layer may be a silicon oxide layer that may be formed using a chemical vapor deposition (CVD) process. An insulation layer, such as a silicon nitride layer, can be used as the first lower interlayer insulation layer.

First contact plugs 180s, 180d connected to the first impurity regions are formed through the first lower interlayer insulation layer. The illustrated first contact plugs include first source plugs 180s contacting the first source regions 170s and first drain plugs 180d contacting the first drain regions 170d. The first contact plugs 180s, 180d may be formed of polycrystal silicon, tungsten, a titanium nitride layer, a tungsten nitride layer and/or copper.

A first metal layer is formed on the fist contact plugs 180s, 180d and patterned to form first pads 190p and first source lines 190s, which are respectively disposed on the first drain plugs 180d and the first source plugs 180s. At this point, the first source lines 190s connect the first source plugs 180s in a direction parallel to the gate line 160. The first metal layer may be formed of a metal material that is stable even at temperatures higher than processing temperatures for depositing a silicon thin layer. For example, the first metal layer may be formed of tungsten, cobalt, tungsten silicide and/or copper. According to some embodiments of the present invention, the first contact plugs can be formed concurrently with formation of the first pads 190p and the first source lines 190s using a damascene process.

Figure 6:
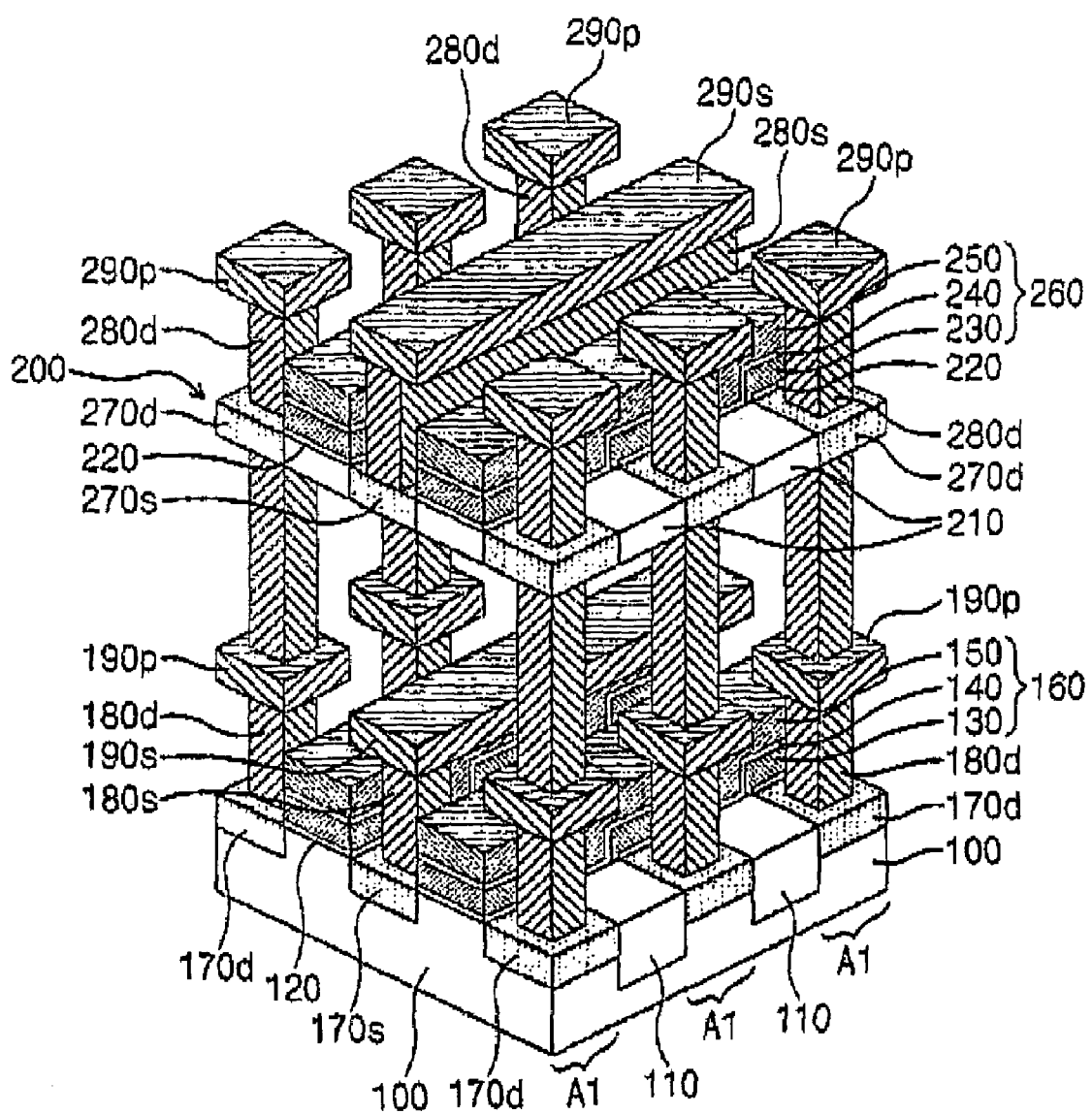

According to further embodiments, one first source plug 180s crosses over the first active regions A1 to connect a plurality of first source regions 170s. Consequently, the first source plug 180s of such embodiments may have a structure substantially identical to a second source pattern 280s (FIG. 6).

Figure 3:
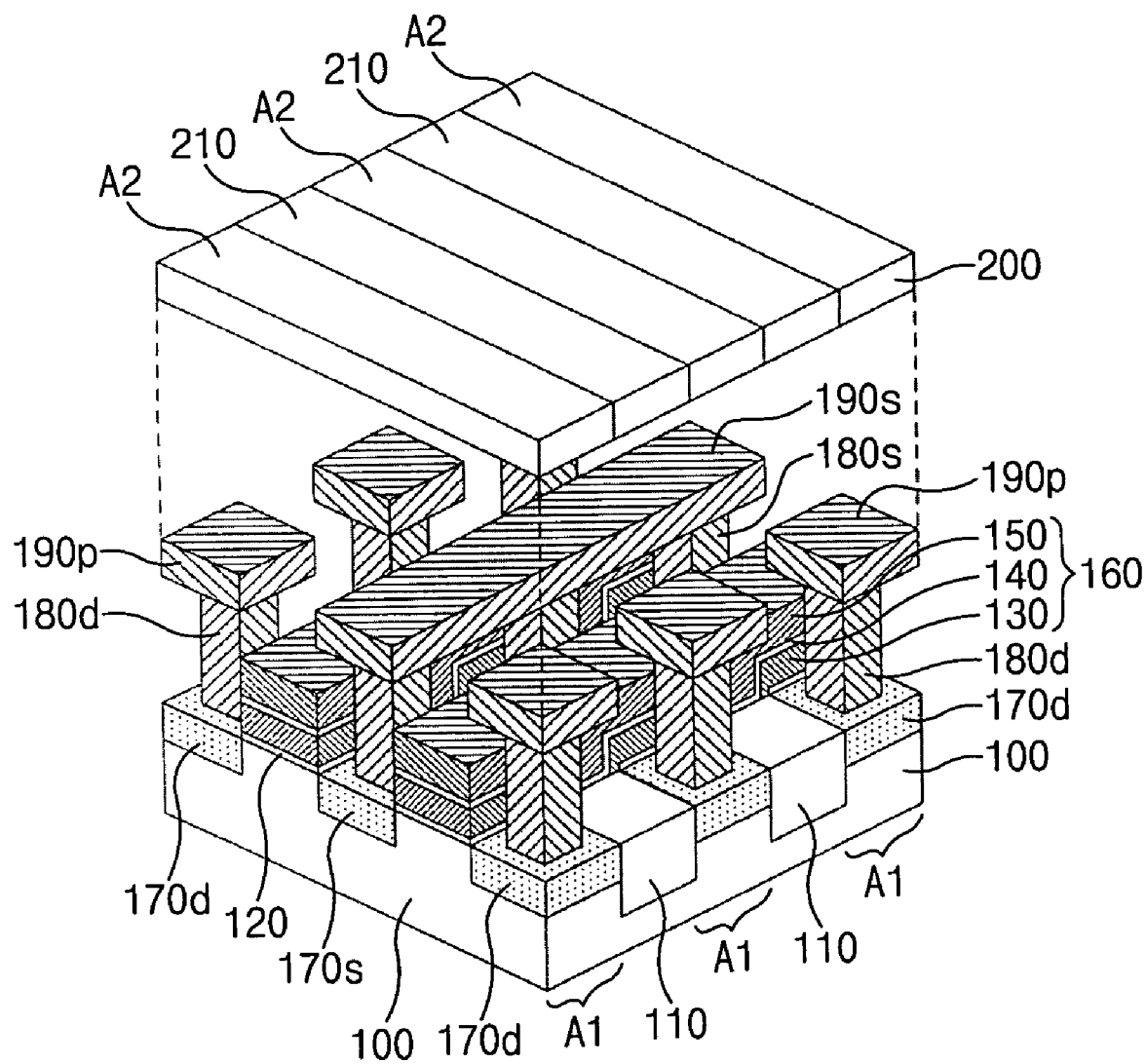

Referring now to FIG. 3, a first upper interlayer insulation layer (not shown) is formed on the structure of FIG. 2, including the first source lines 190s and the first pads 190p. The first upper interlayer insulation layer may be a silicon oxide layer that may be formed using a CVD process.

The first upper interlayer insulation layer and the first lower interlayer insulation layer are patterned to form opening parts that expose a predetermined region of the semiconductor substrate 100. An epitaxial process may be performed, which uses the semiconductor substrate 100 that is exposed through the opening parts as a seed layer, to fill the opening parts in order to form a second semiconductor layer 200 that covers the first upper interlayer insulation layer. As a result, the second semiconductor layer 200 in some embodiments is a silicon layer having a single crystal structure.

In some embodiments, the epitaxial process includes growing single crystal silicon at 800° C. using a processing gas, such as dichlorosilane (DCS) and hydrochloric acid (HCl). The DCS and HCl may be supplied in a flux ratio of about 1.5:1 to about 2.5:1. To increase the stability of the grown single crystal silicon layer, a predetermined thermal treatment process can also be performed. To cover the entire top of the first upper interlayer insulation layer, the second semiconductor layer 200 may be grown to a thicker thickness than the combined thickness of the upper interlayer insulation layer and the lower interlayer insulation layer. The second semiconductor layer 200 may have a thickness of about 1000 to about 10000 Å, and may be a thinner thickness than the first semiconductor layer 100.

The top of the second semiconductor layer 200 may be planarized, for example, using a chemical mechanical polishing (CMP) process. To adjust the thickness of the second semiconductor layer 200 remaining on the first upper interlayer insulation layer, the planarizing of the second semiconductor layer 200 may be carried out for a controlled etching time.

Second device isolation layer patterns 210 defining second active regions A2 are shown formed on a predetermined region of the second semiconductor layer 200. In some embodiments, the second active regions A2 and the second device isolation layer patterns 210 may have, respectively, a substantially identical two-dimensional pattern as the first active regions A1 and the second device isolation layer pattern 110. Consequently, the second active regions A2 and the second device isolation patterns 210 may be disposed parallel to each other in a direction crossing over the first gate lines 160 as shown in FIG. 3.

In some embodiments, as the second semiconductor layer 200 has thinner thickness than the first semiconductor layer (i.e., the semiconductor substrate 100), the bottom of the second device isolation layer patterns 210 can contact the top of the first upper interlayer insulation layer. In this case, the second device isolation layer patterns 210 may have a thickness identical to that of the second semiconductor layer 200, and each of the second active regions A2 may be separated by the second device isolation layer patterns 210. The separating of the second active regions A2 may make it difficult for the SAS technique to be applied when manufacturing a NOR flash memory with a multilevel structure as discussed above. However, as will be described herein, these technical difficulties may be overcome by some embodiments of the present invention.

Figure 4:
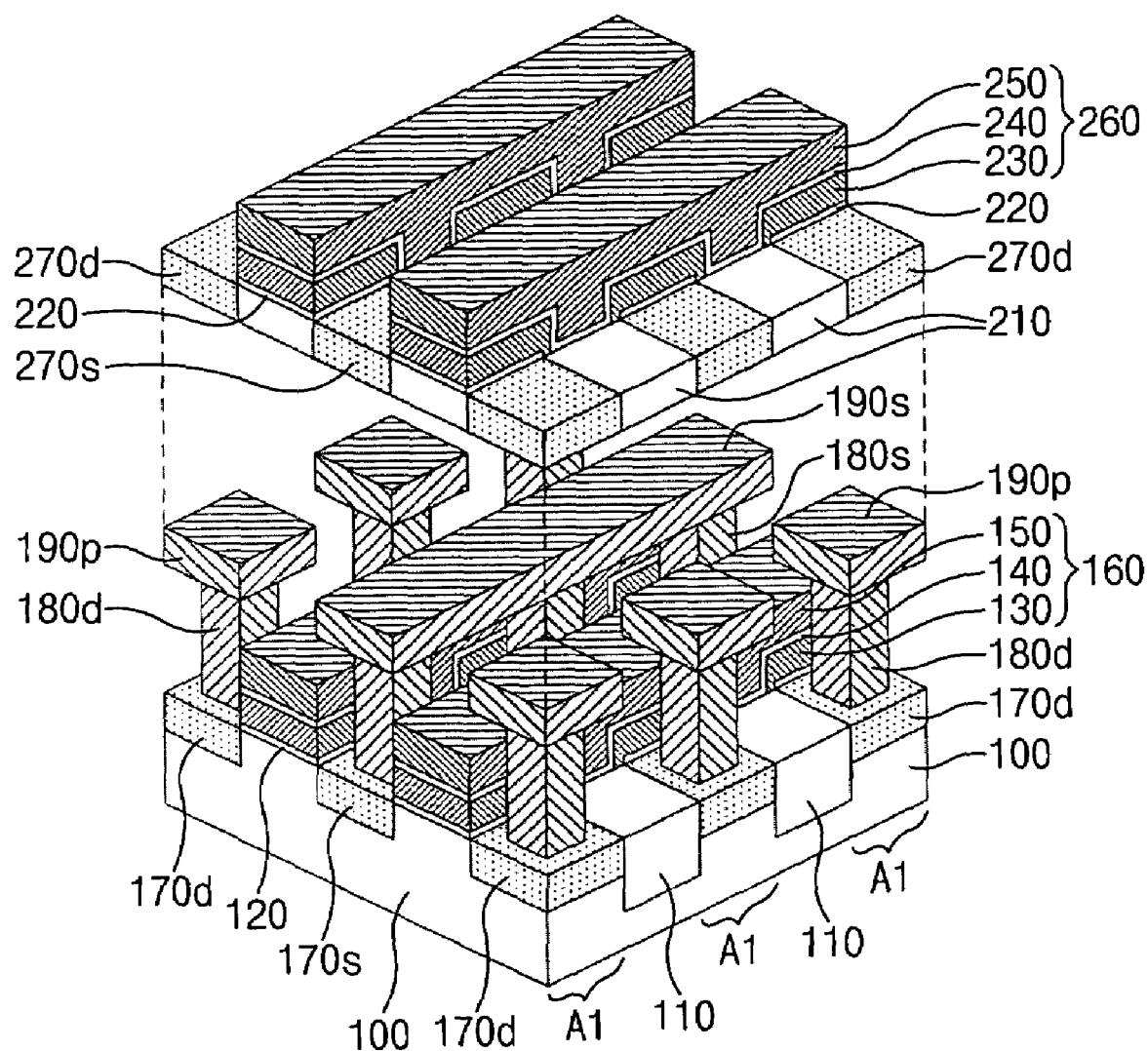

Referring now to FIG. 4, a second gate insulation layer 220 is formed on the second active regions A2. The second gate insulation layer 220 may be a silicon oxide layer formed using a thermal oxidation process. Other kinds of insulation layers (e.g., a silicon nitride layer) can be used as the second gate insulation layer 220. In some embodiments, the second gate insulation layer 220 may be formed of a material and having a thickness substantially identical to those of the first gate insulating layer 120.

After second gate lines 260 crossing over the second active regions A2 are formed on the structure including the second gate insulation layer 220, second impurity regions used as second source regions 270s and second drain regions 270d are formed on the second active regions A2 between the second gate lines 260.

In some embodiments, the second gate lines 260 have a plane arrangement, a material type, and a structure substantially identical to those of the first gate lines 160.

That is, the second gate line 260 may include a plurality of second floating gate electrodes 230, a second gate interlayer insulation layer pattern 240 covering the second floating gate electrodes 230 and a second control gate electrode 250. The second floating gate electrodes 230 may be two-dimensionally arranged on the second active regions A2 and separated from each other. The second gate interlayer insulation layer pattern 240 and the second control gate electrode 250 may cover the second floating gate electrodes 230 in a direction crossing over the second active regions A2. The second floating gate electrode 230 can be formed, for example, of a silicon oxide layer and/or a silicon nitride layer. The second control gate electrode 250 can be formed, for example, of stacked polycrystal silicon and metal conductive layers.

In some embodiments, the second impurity regions can be formed by a method substantially identical to the method used in forming the first impurity regions. For example, the second impurity regions can be formed using an ion implantation process that uses spacers (not shown) on the second gate lines 260 and/or sidewalls thereof as a mask. In some embodiments, to obtain stable product characteristics, the second semiconductor layer 200, the second device isolation layer pattern 210, the second gate insulating layer 220, the second gate lines 260, and the second impurity regions can be formed using process conditions different from those used for fabricating structures corresponding to memory transistors formed on the first semiconductor layer.

Figure 5:
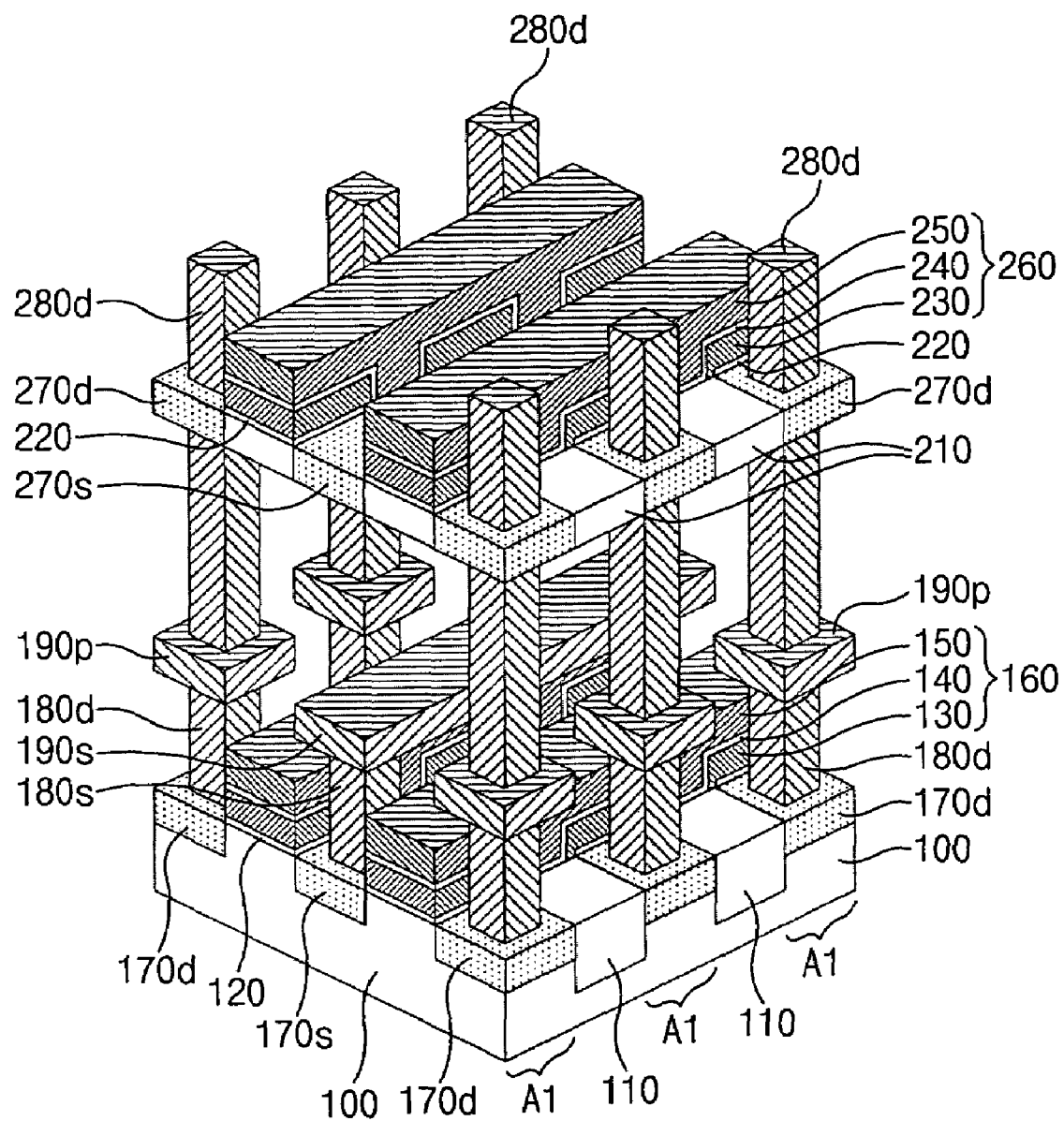

Referring to FIG. 5, a second lower interlayer insulation layer (not shown) is formed on the structure including the second impurity regions. The second lower interlayer insulation layer may be a silicon oxide layer formed using a CVD process. A silicon nitride layer may be used as the second lower interlayer insulation layer.

Figure 10:
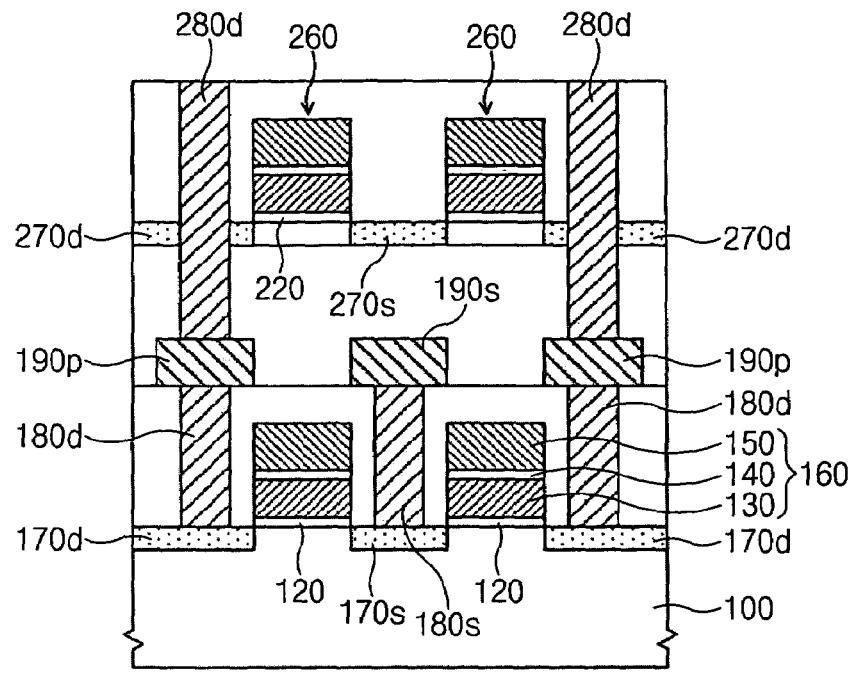
FIG. 10 is a cross-sectional view of a plug structure according to some embodiments of the present invention.

Second drain plugs 280d contacting the second drain regions 270d are formed through the second lower-interlayer insulation layer. The second drain plugs 280d may be formed, for example, of tungsten, polycrystal silicon, a titanium nitride layer, a tungsten nitride layer and/or copper. In some embodiments, the second drain plugs 280d pass through the second semiconductor layer 200 and the first upper interlayer insulation layer to contact the top of the first pads 190p (see FIG. 10). As a result, each of first and second drain regions 170d and 270d may be electrically connected to each other by the first and second drain plugs 180d and 280d and the first pad 190p with a stack-via plug structure.

In some embodiments, when forming the first source lines 190s, the first pads 190p are not formed as seen in FIG. 1. In this case, the second drain plugs 280d may directly contact the top of the first drain plugs 180d. Such an approach may be used, for example, in applications where it is difficult to obtain a space margin between the first pads 190p and the first source line 190s.

Referring now to FIG. 6, the second source patterns 280s that contact the second source regions 270s are formed through the second lower interlayer insulation layer. The second source patterns 280s are shown arranged in a direction crossing over the second source regions 270s and the second device isolation layer patterns 210 adjacent to the second source regions 270s. The second source patterns 280 may have a structure different from that of the first source plugs 180s. The second source patterns 280s can be formed, for example, of tungsten, polycrystal silicon, a titanium nitride layer, a tungsten nitride layer, and/or copper.

Figure 11:
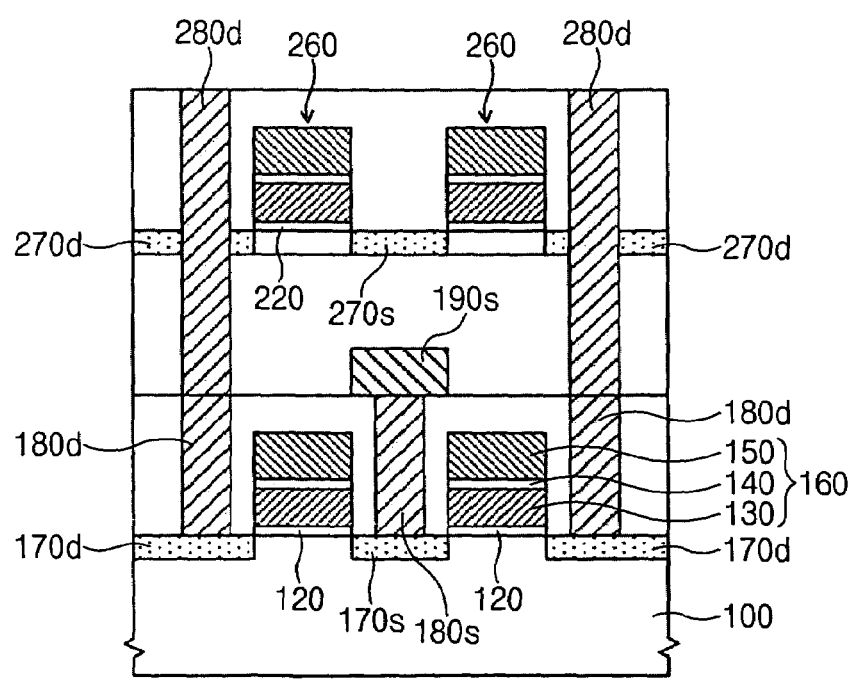
FIG. 11 is a cross-sectional view of a plug structure according to further embodiments of the present invention.

After a second metal layer is formed on the structure including the second source patterns 280s, the resulting structure may be patterned to form second pads 290p, that are respectively disposed on the top of the second drain plugs 280d, and second source lines 290p, that are respectively disposed on the second source patterns 280d. The second metal layer may be formed, for example, of tungsten, cobalt, tungsten silicide, cobalt silicide and/or copper. The forming of the second source lines 290s and the second pads 190p can use processing conditions and a photo mask substantially the same as used for the forming of the first source lines 190s and the first pads 190p. Furthermore, as illustrated in FIG. 11, some embodiments may not include the second pads 290p.

Figure 9:
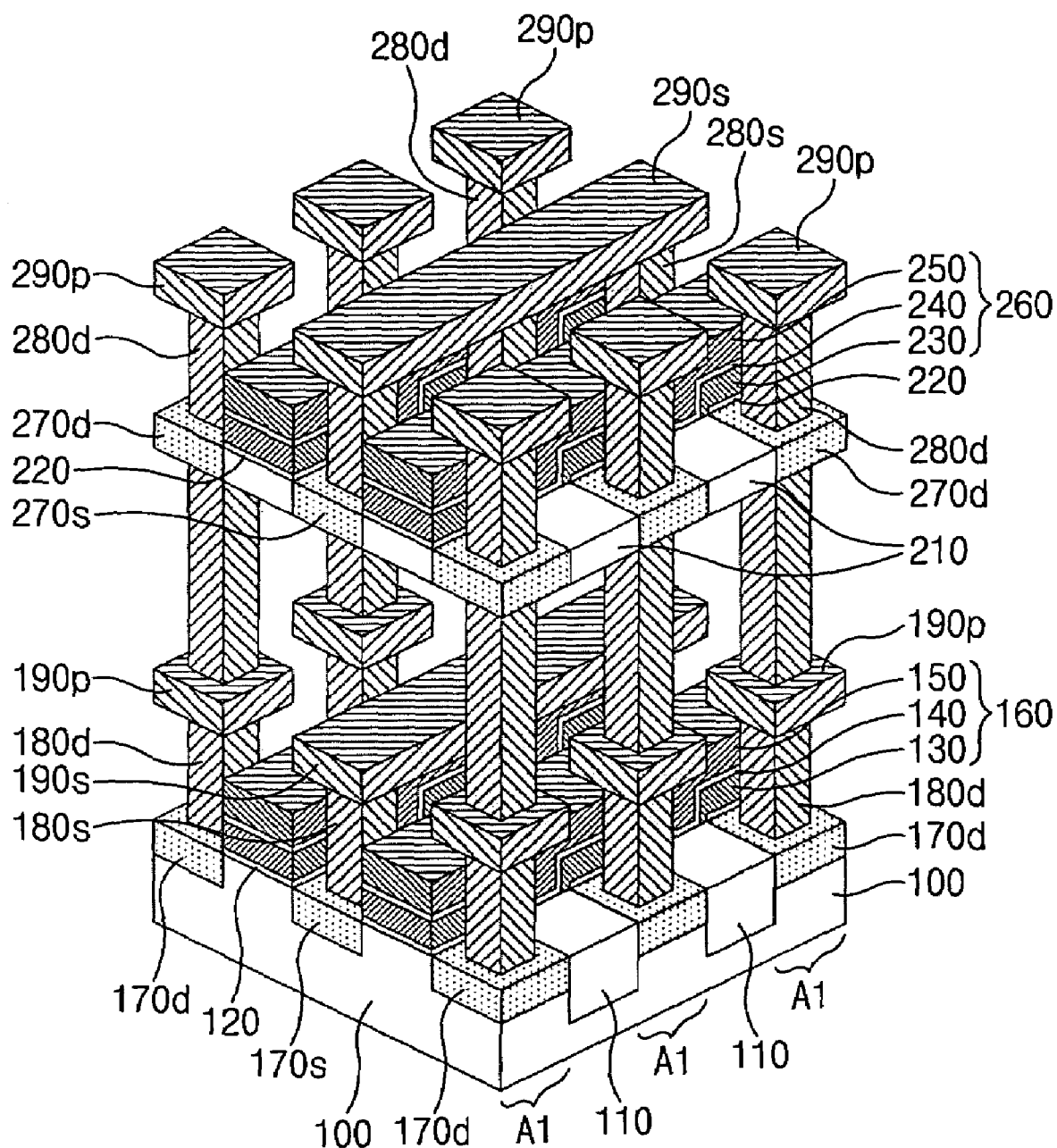
FIG. 9 is a perspective view illustrating a method of fabricating a semiconductor device according to further embodiments of the present invention.
Figure 12:
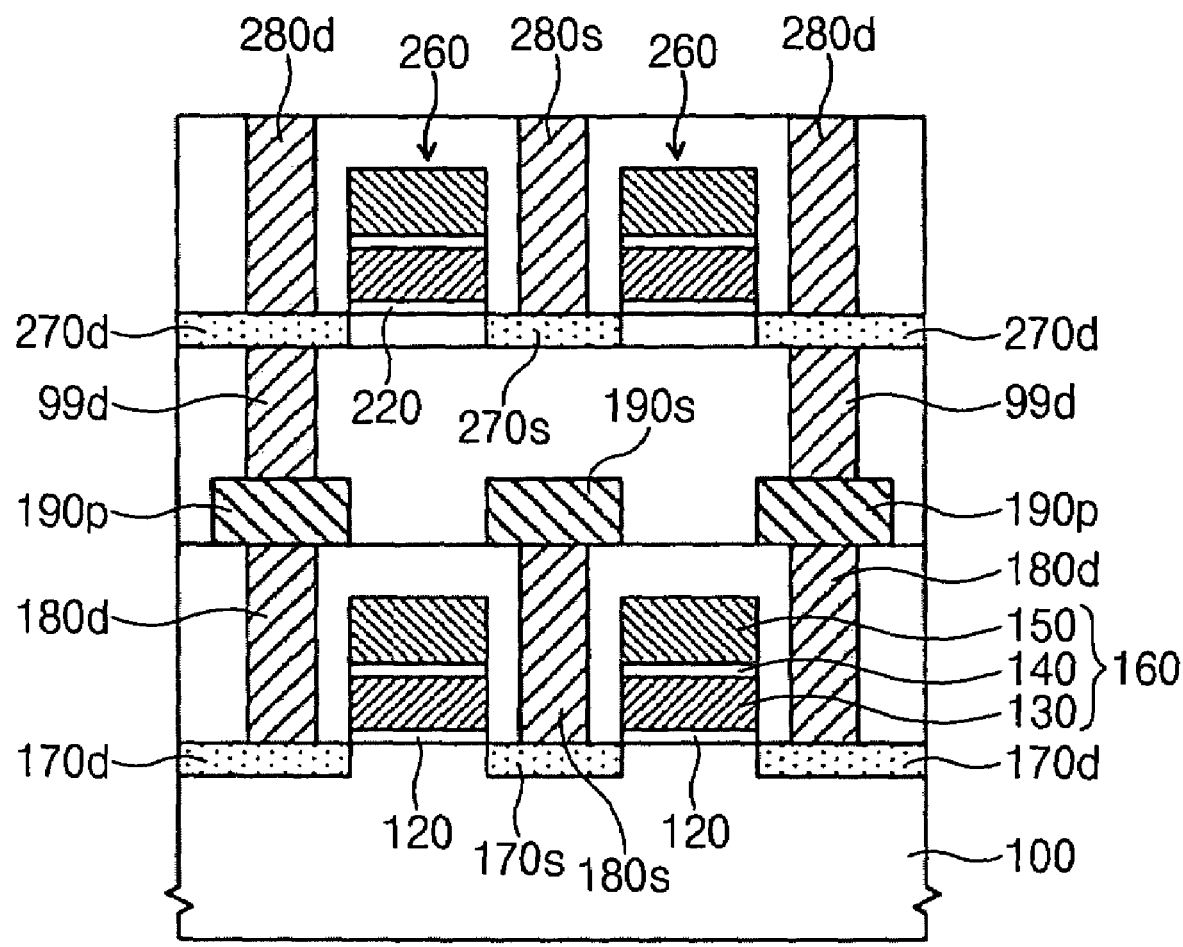
FIG. 12 is a cross-sectional view of a plug structure according to still further embodiments of the present invention.

In some embodiments, the second source patterns 280s may be formed of a structure substantially identical to that of the first source plugs 180s. The second drain plugs 280d may not pass through the second semiconductor layer 200. The second drain plugs 280d may contact the top of the second drain region 270d as illustrated in FIGS. 9 and 12. In this case, to electrically connect the first and second drain regions 170d and 270d, an auxiliary drain plug 99d can be disposed between the first pad 190p and the second drain region 270d as best seen in FIG. 12. In such embodiments, the technical difficulty of anisotropically etching the first upper interlayer insulation layer, the second semiconductor layer 200, and the second lower interlayer insulation layer may be reduced. Moreover, the second source patterns 280s and the second drain plugs 280d may be simultaneously formed and may have identical structures.

Figure 7:
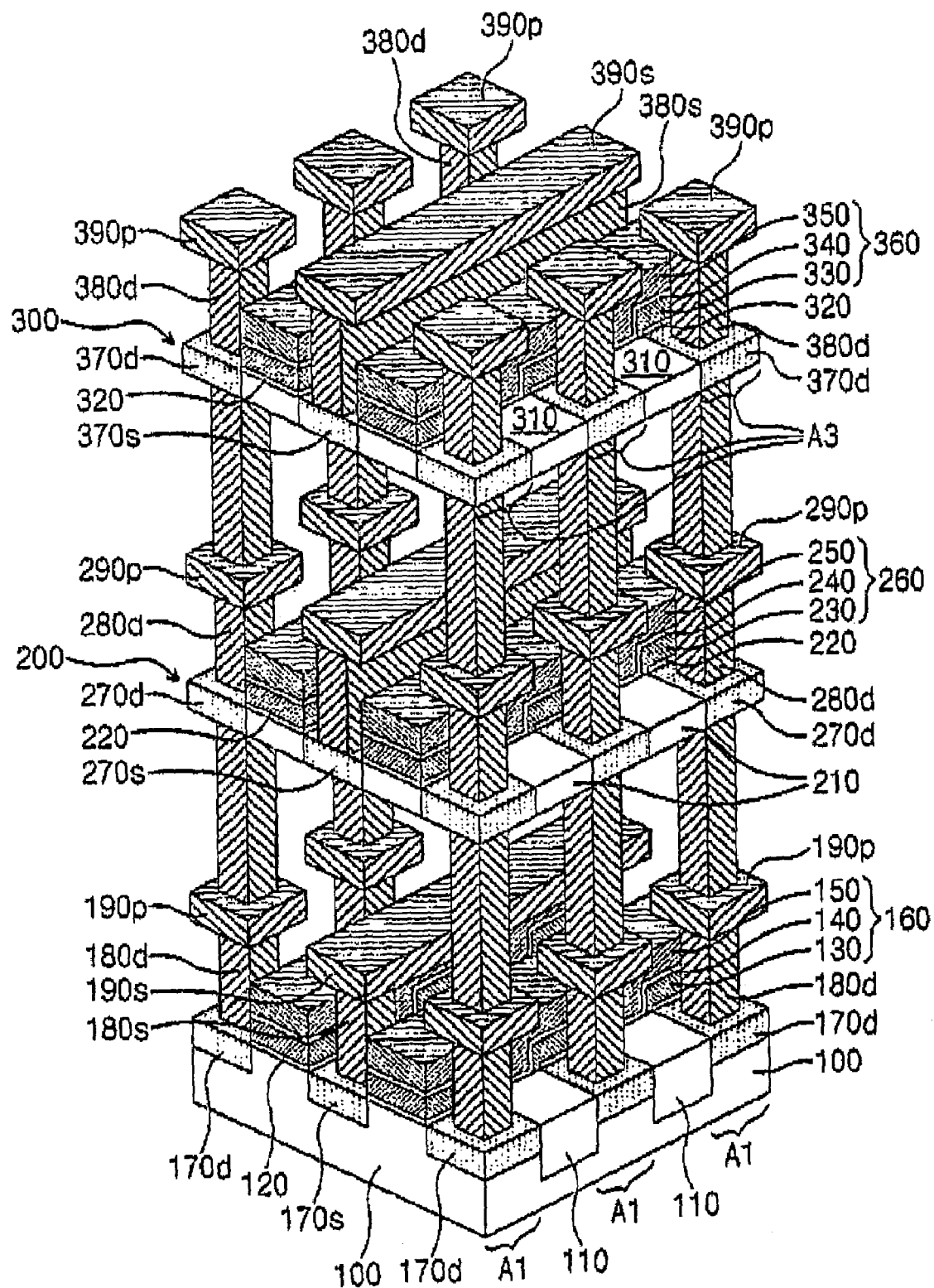

Referring now to FIG. 7, a second upper interlayer insulation layer (not shown) is formed on the structure including the second source lines 290s and the second pads 290p. The second upper interlayer insulation layer and the second lower interlayer insulation layer are patterned to form opening parts that expose a predetermined region of the second semiconductor layer 200. Then, an epitaxial process using the exposed second semiconductor layer 200 as a seed layer may be performed to fill the opening part and form a third semiconductor layer 300 covering the second upper interlayer insulation layer. The third semiconductor layer 300 can be a silicon layer having a single crystal structure.

Third device isolation layer patterns 310 are formed on the third semiconductor layer 300 to define the third active regions A3, and a third gate insulation layer 320 is formed on the third active regions A3. A third gate insulation layer 320 is formed to cross over the third active regions A3. Third impurity regions, which are used as third source regions 370s and third drain regions 370d, are formed in the third active region A3 between the third gate lines 360. In some embodiments, the third gate lines 360 have a plane arrangement, a material type, and a structure substantially identical to those of the second gate lines 260. That is, the third gate line 360 may include a plurality of third floating gate electrodes 330, a third gate interlayer insulation layer pattern 340 and a third control gate electrode 350 that sequentially cover the third floating gate electrodes 330.

A third lower interlayer insulation layer (not shown) is formed on the structure including the third impurity regions. Through the third lower interlayer insulation layer, third drain plugs 380d and third source patterns 380s are, respectively, connected to the third drain regions 370d and the third source regions 370s. Third pads 390p are formed disposed on the top of the third drain plugs 380d, respectively. Third source lines 390s are formed disposed on the top of the third source patterns 380s.

In some embodiments, processes for forming of the second upper interlayer insulating layer through forming of the third source lines 390s may be substantially identical to those described for forming of the first upper interlayer insulation layer through forming of the second source lines 290s. In other embodiments, differences may exist between the respective processes. Furthermore, the series of processes can be repeated a predetermine number of times based on a desired number of layers. As such, a semiconductor device having more semiconductor layers and increased integration density can be manufactured in some embodiments.

Figure 8:
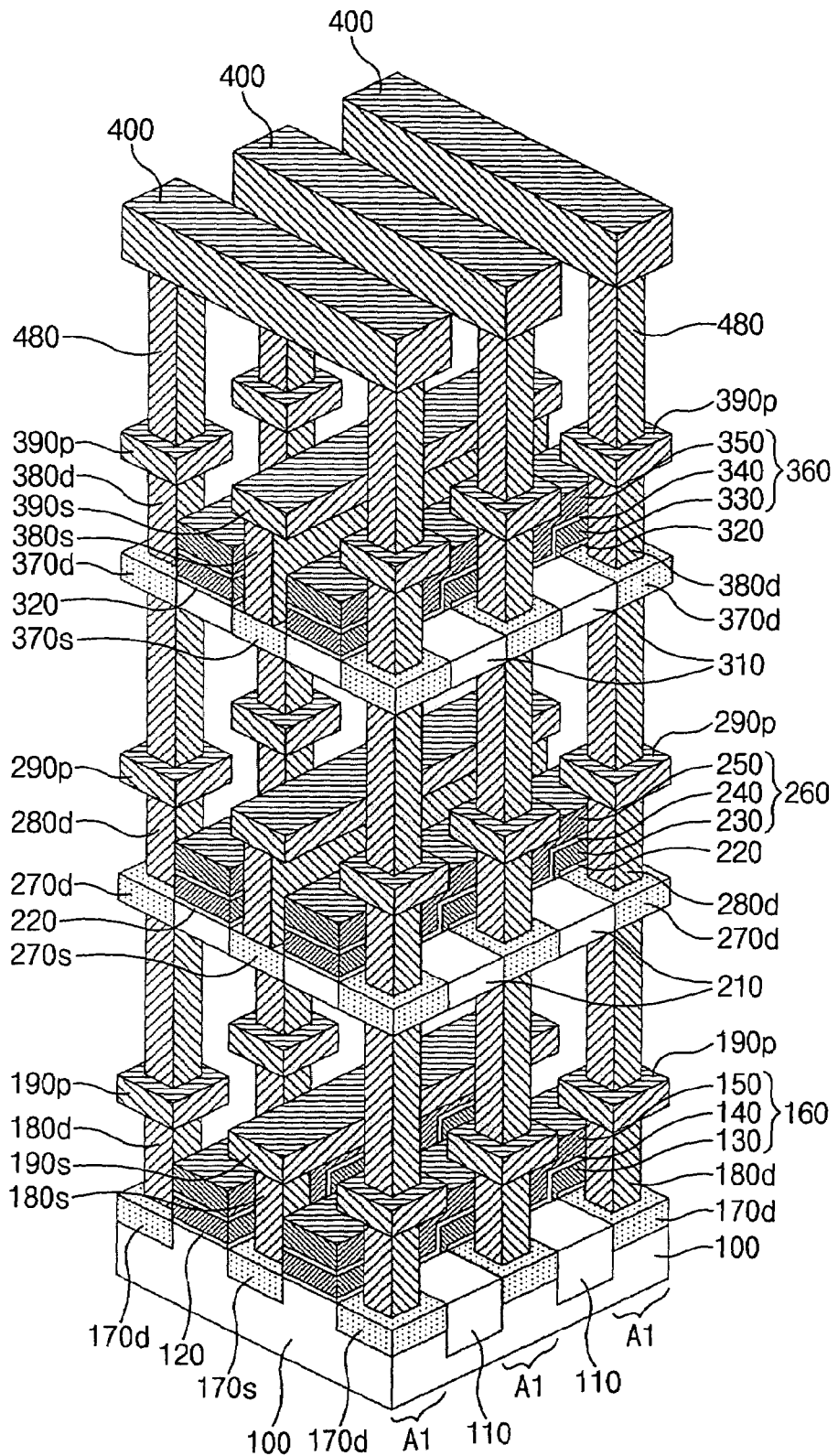

Referring now to FIG. 8, a third upper interlayer insulation layer (not shown) is formed on the structure including the third source lines 390s. The third upper interlayer insulation layer may be a silicon oxide layer formed by using a CVD process. Fourth drain plugs 480 contacting the top of the third pads 390p are formed through the third upper interlayer insulation layer. The fourth drain plugs 480 can be formed using a method and a photo mask substantially identical to that described for forming of the first to third drain plugs 180d, 280d, and 380d.

Bit lines 400, connecting the fourth drain plugs 480 on the third upper interlayer insulation layer, are formed on the third upper interlayer insulation layer. At this point, the bit lines 400 are shown arranged in a direction crossing over the first gate lines 160. In some embodiments, the first to third drain regions 170d, 270d, and 370d are electrically connected to the bit lines 400. The bit lines 400 may be formed, for example, of tungsten, cobalt, tungsten silicide, cobalt silicide and/or copper.

Figure 13:
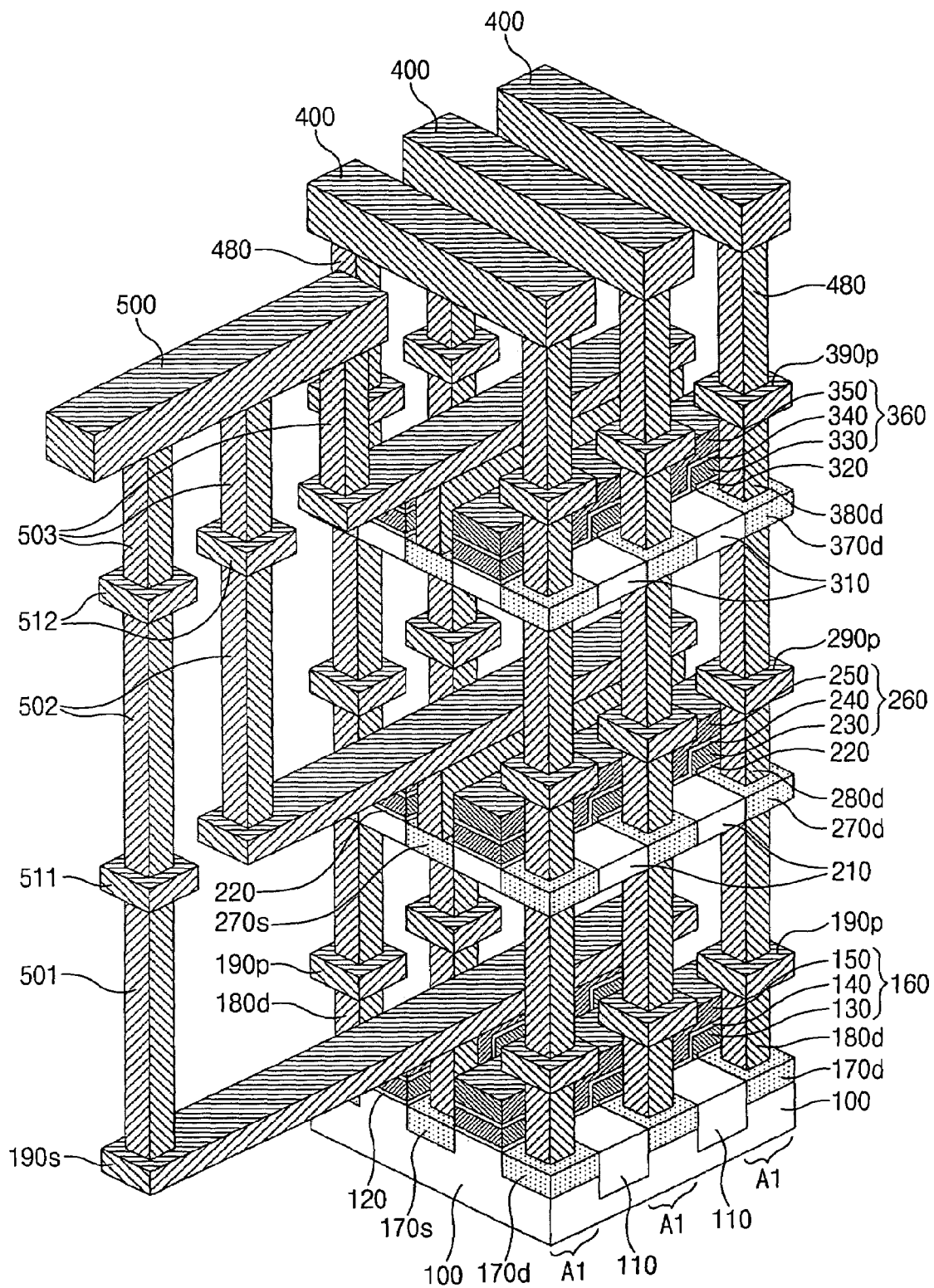
FIG. 13 is a perspective view illustrating a method for connecting a local source line structure and a common source line according to some embodiments of the present invention.

In some embodiments, the first to fourth drain plugs 180d, 280d, 380d, and 480d and/or the first to third pads 190p, 290p, 390p constitute a drain plug structure. Additionally, the first to fourth drain plugs 180d, 280d, 380d, and 480d and/or the first to third pads 190p, 290p, 390p constitute a local source line structure connecting the source regions 170s, 270s, and 370s formed, respectively, on the semiconductor layers 100, 200, and 300 below the first to fourth drain plugs 180d, 280d, 380d, and 480d and/or the first to third pads 190p, 290p, and 390p. A common source line 500 (or, a global source line) contacting the local source line structure is shown in FIG. 13 disposed on the third upper interlayer insulation layer. IN some embodiments, the series of processes for forming the drain plug structure can be used to connect the local source line structure and the common source line.

FIG. 13 is a perspective view illustrating a method for connecting a local source line structure and a common source line according to some embodiments of the present invention. As shown in FIG. 13, the first to third source lines 190s, 290s, and 390s are extended beyond the regions on which the bit lines 400 are disposed. The first to third source lines 190s, 290s, and 390s are connected to the common source line 500 through the respectively different global source plug structure. In this connection, to obtain a space margin between the global source plug structures, each extension length of the first to third source lines 190s, 290s, and 390s is varied in the illustrated embodiments of FIG. 13.

More specifically, the first source line 190s is longer than the second source line 290s and the second source line 290s is longer than the third source line 390s.

In some embodiments, the global source plug structure includes sequentially stacked first to third plugs 501, 502, and 503. Furthermore, a first source pad 511 can be disposed between the first and second plugs 501 and 502 and a second source pad 512 can be disposed between the second and third plugs 502 and 503. In this case, the first source line 190s is connected to the common source line 500 through the first to third plugs 501, 502, and 503, and the first and second source pads 511 and 512. The second source line 290s is connected to the common source line 500 through the second and third plugs 502 and 503, and the second source pad 512. The third source line 390s is connected to the common source line 500 through the third plug 503.

In some embodiments, the global source plug structure can be formed using a process used in forming of the drain plug structure. More specifically, the first to third plugs 501, 502, and 503 can be formed by the processes used to form the second to fourth drain plugs 280d, 380d, and 480d, respectively, and thereby formed concurrently therewith. The fist and second source pads 511 and 512 can be formed by the processes used to form the second and third pads 290p and 390p, respectively, and thereby formed concurrently therewith. As illustrated in FIG. 7, when the second and third source patterns 280s and 380s have a structure that crosses over the active regions, this approach may be applied as there is no requirement that the second and third plugs 502 and 503 are formed to pass through the second and third source patterns 280s and 380s.

Figure 14:
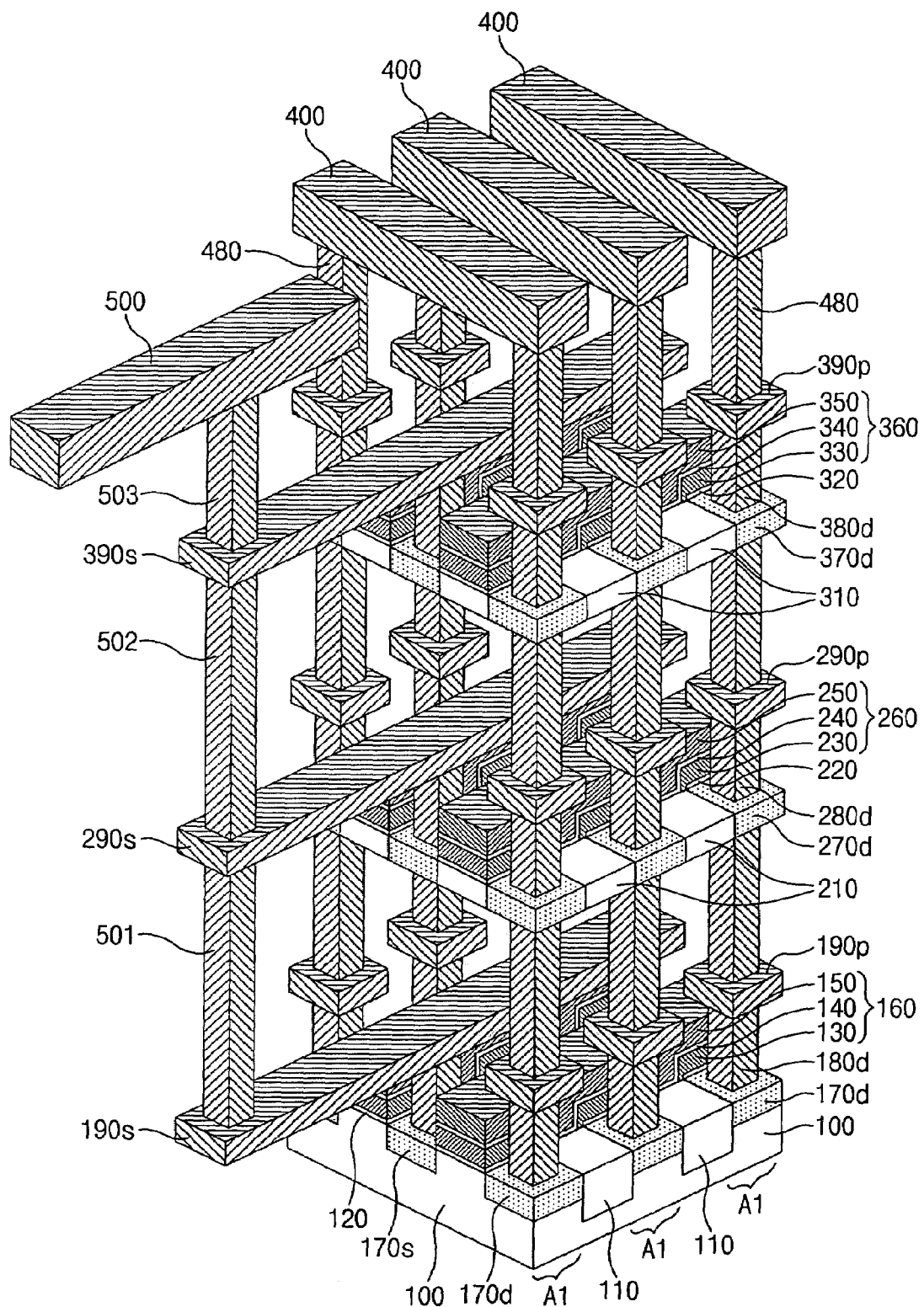
FIG. 14 is a perspective view illustrating a method for connecting a local source line structure and a common source line according to other embodiments of the present invention.

FIG. 14 is a perspective view illustrating a method for connecting a local source line structure and a common source line according to other embodiments of the present invention. Referring to FIG. 14, as described above, the first to third source lines 190s, 290s, and 390s are extended beyond the region on which the bit lines 400 are disposed. However, according to the embodiments illustrated in FIG. 14, the first to third source lines 190s, 290s, and 390s can be formed by using the same photo mask. As a result, each of the extension lengths in the first to third source lines 190s, 290s, and 390s can be identical. In this case, the fist to third source lines 190s, 290s, and 390s are connected to the common source line 500 through the global source plug structure.

In the embodiments of FIG. 14, the global source plug structure includes the sequentially-stacked first, second, and third plugs 501, 502 and 503. The first plug 501 is disposed between the first and second soured lines 190s and 290s. The second plug 502 is disposed between the second and third source lines 290s and 390s. The third plug 503 is disposed between the third and common source lines 390s and 500.

Some embodiments of the present invention provide a semiconductor device of a multilevel structure with local source line structures. The local source lines are directly connected to a global source line using global source plug structures of a metal material. Accordingly, the electric resistance between the source region and the global region in the transistor can be reduced. In some embodiments, when this line structure is applied to a NOR flash memory source line structure, a fast operating speed can be achieved.

Moreover, according to some embodiments of the present invention, there are provided drain plug structures that directly connect drain regions of the transistors and the bit lines. The drain plug structures are also formed of metal material. Thus, the electric resistance between the drain regions and the bit lines may be reduced. Compared to the conventional line structure that passes through a channel region of the select transistor, the drain line structure of some embodiments of the preset invention may serve to reduce resistance between the bit lines and the drain regions.

Some embodiments of the present invention provide a semiconductor device having a multilevel structure of a low-resistance line. Further embodiments provide a NOR flash memory device having a multilevel structure of a low-resistance line. Other embodiments provide a method of fabricating a semiconductor device having a multilevel structure of a low-resistance line. Further embodiments provide a method of fabricating a NOR flash memory device having a multilevel structure of a low-resistance line.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
a plurality of stacked semiconductor layers;
a plurality of transistors on each of the semiconductor layers, the transistors including gate lines and having source regions and drain regions formed between the gate lines in the respective semiconductor layer including the transistors, wherein each of the transistors includes at least one information storage element that defines a unit memory cell configured to store data;
a plurality of local source line structures, each of the local source line structures being positioned on a corresponding one of the semiconductor layers and connecting a plurality of the source regions formed on the corresponding one of the semiconductor layers.

2. The semiconductor device of claim 1, further comprising a plurality of bit lines overlying the semiconductor layers and wherein the local source line structures extend in a direction crossing the bit lines and wherein the semiconductor device further comprises a plurality of drain plugs, ones of which connect associated ones of the drain regions formed on a plurality of different ones of the semiconductor layers to associated ones of the bit lines.

3. The semiconductor device of claim 1, wherein the plurality of semiconductor layers comprise single crystal silicon layers.

4. The semiconductor device of claim 1, wherein at least one of the plurality of semiconductor layers comprises an epitaxial layer.

5. The semiconductor device of claim 2, wherein the drain plugs connect the associated ones of the drain regions to the associated ones of the bit lines without an intervening select transistor.

6. The semiconductor device of claim 2, wherein the bit lines and the local source line structures comprise a metal material.

7. The semiconductor device of claim 6, wherein the metal material of the local source line structures comprises a material that is stable at temperatures higher than a deposition temperature for forming a silicon thin film.

8. The semiconductor device of claim 1, wherein the local source line structures each comprise:
a metal local source line extending in a direction parallel to the gate lines and overlying the plurality of source regions connected by the local source line; and
a plurality of local source plugs connecting the local source line to the source regions underlying the local source line, respective ones of the local source plugs connecting an associated one of the source regions underlying the local source line.

9. The semiconductor device of claim 1, wherein the local source line structures each comprise:
a metal local source line extending in a direction parallel to the gate lines and overlying the plurality of source regions connected by the local source line; and
a local source pattern between the local source line and the plurality of source regions underlying the local source line, a bottom of the local source pattern contacting tops of the underlying source regions.

10. The semiconductor device of claim 2, wherein each of the drain plugs extend in a vertical direction from a lowest one of the semiconductor layers to at least one overlying semiconductor layer to connect drain regions on the lowest one and the at least one overlying one of the semiconductor layers to the associated one of the bit lines and wherein the bit lines overlie the plurality of semiconductor layers.

11. The semiconductor device of claim 2, wherein each of the bit lines extends in a direction substantially orthogonal to the gate lines and electrically connects to an associated plurality of the drain plugs.

12. The semiconductor device of claim 1, further comprising device isolation layer patterns disposed on a predetermined region of each of the semiconductor layers to define active regions therein, wherein a lowest one of the semiconductor layers has a thickness greater than a thickness of the device isolation layer pattern formed thereon, and wherein all overlying ones of the semiconductor layers have a thickness substantially identical to a thickness of device isolation layer patterns formed thereon.

13. The semiconductor device of claim 1, wherein semiconductor layers, except for a lowest one of the semiconductor layers, are divided into a plurality of independent active regions by device isolation layer patterns formed on the semiconductor layers.

14. The semiconductor device of claim 12, wherein the gate lines comprise a non-volatile memory gate structure comprising:
control gate patterns crossing over the active regions;
floating gate patterns between the control gate patterns and the active regions; and
gate interlayer insulation patterns between the floating gate patterns and the control gate patterns, wherein the floating gate patterns define the at least one information storage element.

15. The semiconductor device of claim 14, wherein the source regions connected by the local source line structures and the drain regions connected by the bit lines are alternately arranged on the active regions between the gate lines and the transistors form a cell array of a NOR flash memory.

16. The semiconductor device of claim 2, wherein the drain plugs pass through drain regions of ones of the semiconductor layers to reach a lowest one of the semiconductor layers.

17. The semiconductor device of claim 1, wherein the local source line structures are connected to a global source line through a global source plug structure including a plurality of substantially aligned plugs.

18. The semiconductor device of claim 1, wherein ones of the local source line structures are connected to a global source line through respective different offset global source plug structures.

19. The semiconductor device of claim 2, wherein each of the plurality of drain plugs includes a pad between sections of the drain plugs.

20. The semiconductor device of claim 19, wherein each of the plurality of drain plugs further includes an auxiliary drain plug positioned between the pad and a next one of the sections of the drain plugs.

21. The semiconductor device of claim 1, wherein each of the semiconductor layers has its corresponding local source line structure thereon without any other of the semiconductor layers intervening therebetween.

* * * * *